(12) United States Patent
Sakai

(10) Patent No.: US 11,251,104 B2
(45) Date of Patent: Feb. 15, 2022

(54) SEMICONDUCTOR DEVICE

(71) Applicant: Mitsubishi Electric Corporation, Tokyo (JP)

(72) Inventor: Junya Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/009,301

(22) Filed: Sep. 1, 2020

(65) Prior Publication Data

US 2021/0265232 A1     Aug. 26, 2021

(30) Foreign Application Priority Data

Feb. 20, 2020   (JP) .............. JP2020-027407

(51) Int. Cl.
*H01L 23/367*   (2006.01)
*H01L 29/16*    (2006.01)
*H01L 29/20*    (2006.01)

(52) U.S. Cl.
CPC ........ *H01L 23/367* (2013.01); *H01L 29/1602* (2013.01); *H01L 29/1608* (2013.01); *H01L 29/2003* (2013.01)

(58) Field of Classification Search
None
See application file for complete search history.

(56) References Cited

U.S. PATENT DOCUMENTS

2021/0265232 A1* 8/2021 Sakai .................... H01L 23/367

FOREIGN PATENT DOCUMENTS

JP      H11-168161 A    6/1999

* cited by examiner

*Primary Examiner* — Jack S Chen
(74) *Attorney, Agent, or Firm* — Studebaker & Brackett PC

(57) ABSTRACT

A semiconductor device includes: a base plate having a heat dissipation surface and a mounting surface opposite to each other; a semiconductor chip mounted on the mounting surface of the base plate; a sealing material sealing the semiconductor chip; a first sheet adhering to the heat dissipation surface of the base plate and having plural openings; and a second sheet covering the first sheet.

20 Claims, 6 Drawing Sheets

SEMICONDUCTOR DEVICE

BACKGROUND OF THE INVENTION

Field

The present disclosure relates to a semiconductor device.

Background

In semiconductor devices in related art, a little corrosion or rust of a base plate has not been a problem. A current capacity has been increased as generations of semiconductor devices advance. Along with this, the problem of corrosion or rust of the base plate has been unignorable. Corrosion or rust generated in the base plate acts as an obstacle to dissipation of heat generated in energization, which leads to abnormal heat generation of a semiconductor device, and possibly impairs reliability. It is possible to restore a main terminal and an auxiliary terminal by polishing even if corrosion or rust occurs; however, the base plate may not be restored by polishing because its flatness is under control. In particular, in a semiconductor device using a wide bandgap semiconductor, the current capacity of which is significantly increased compared to devices in related art, a slight difference in the amount of corrosion or rust has a large impact on reliability. Another problem is that a plating process is costly. In this connection, it has been proposed to apply grease to a base plate in order to prevent corrosion and rust before shipment (for example, see JP H11-168161 A).

SUMMARY

However, because grease degrades over time in general, the grease loses original heat dissipation performance while a semiconductor device is stored in a warehouse or the like of a user for a long period of time after shipment. The thickness of the grease becomes uneven due to shocks or vibration in transportation, and reliability is impaired.

An object of the present disclosure, which has been made to solve the above-described problem, is to provide a semiconductor device that can withstand long term storage and retain reliability.

A semiconductor device according to the present disclosure includes: a base plate having a heat dissipation surface and a mounting surface opposite to each other; a semiconductor chip mounted on the mounting surface of the base plate; a sealing material sealing the semiconductor chip; a first sheet adhering to the heat dissipation surface of the base plate and having plural openings; and a second sheet covering the first sheet.

In the present disclosure, the first sheet having the plural openings adheres to the heat dissipation surface of the base plate, and the second sheet covers the first sheet. The second sheet is peeled off immediately before mounting the semiconductor device, and the grease is applied to the base plate by using the first sheet as a mask. Because the grease is applied immediately before use, a concern for degradation of the grease over time may be avoided. Because the second sheet covers the first sheet, the heat dissipation surface of the base plate may be prevented from contacting with outside air. Accordingly, the base plate may be prevented from being corroded or rusted due to outside air environments other than a temperature during transportation or use. Thus, long term storage is possible, and reliability may be retained.

Other and further objects, features and advantages of the invention will appear more fully from the following description.

DESCRIPTION OF EMBODIMENTS

Figure 1:
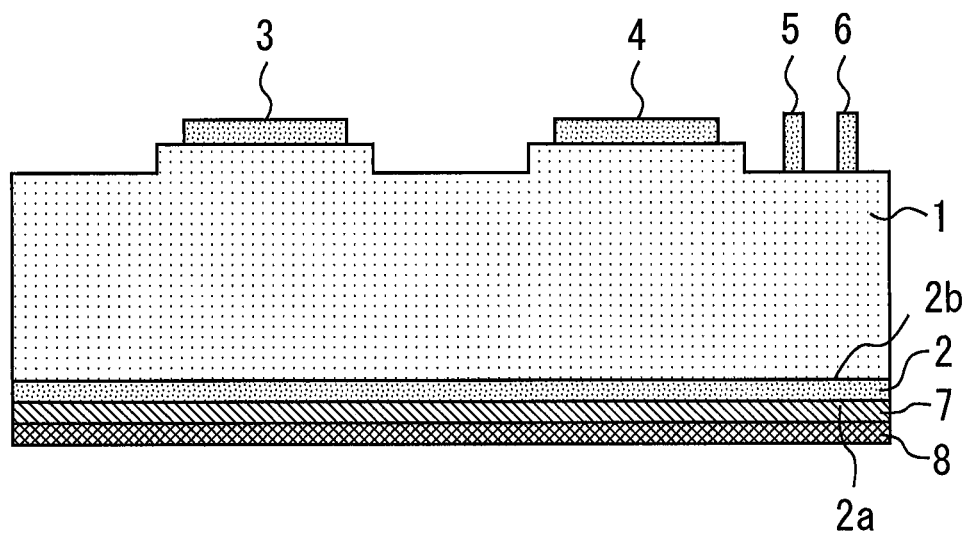
FIG. 1 is a side view that illustrates a semiconductor device according to an embodiment.
Figure 2:
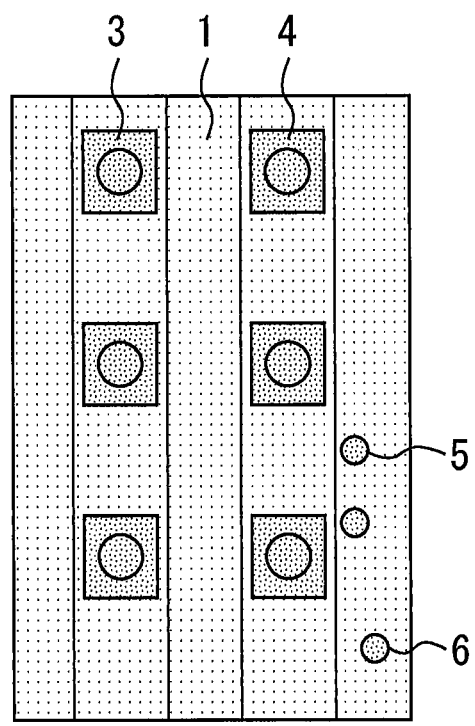
FIG. 2 is a top view that illustrates the semiconductor device according to the embodiment.
Figure 3:
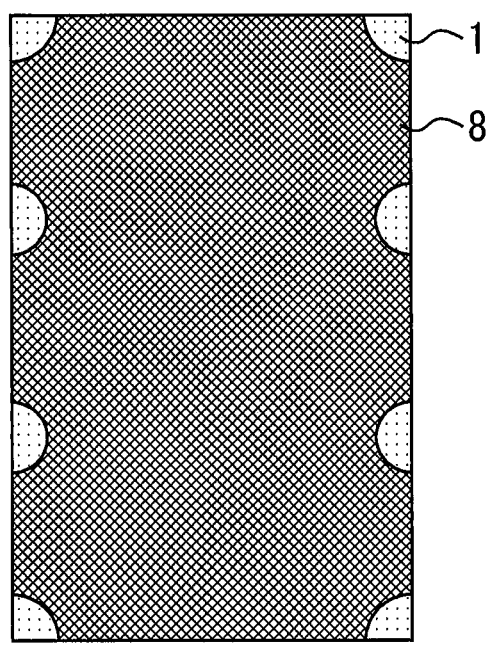
FIG. 3 is a bottom view that illustrates the semiconductor device according to the embodiment.

FIG. 1 is a side view that illustrates a semiconductor device according to an embodiment. FIG. 2 is a top view that illustrates the semiconductor device according to the embodiment. FIG. 3 is a bottom view that illustrates the semiconductor device according to the embodiment. A base plate 2 is provided on a lower surface of a casing 1. A material of the casing 1 is PET/PBT or PPS. A material of the base plate 2 is AlSiC, Cu, Al, or the like. Main current terminals 3 and 4, drive terminals 5 and a sensor terminal 6 are provided on an upper surface of the casing 1.

The base plate 2 has a heat dissipation surface 2a and a mounting surface 2b opposite to each other. A first sheet 7 adheres to the heat dissipation surface 2a of the base plate 2. A second sheet 8 covers the first sheet 7. A material of the first sheet 7 is plastic, a graphite sheet, or the like. A material and a film thickness of the second sheet 8 are not limited. As materials of the first sheet 7 and the second sheet 8, the materials are preferable which do not degrade over time, that is, whose material quality, weight, insulation, or conductivity do not change.

Figure 4:
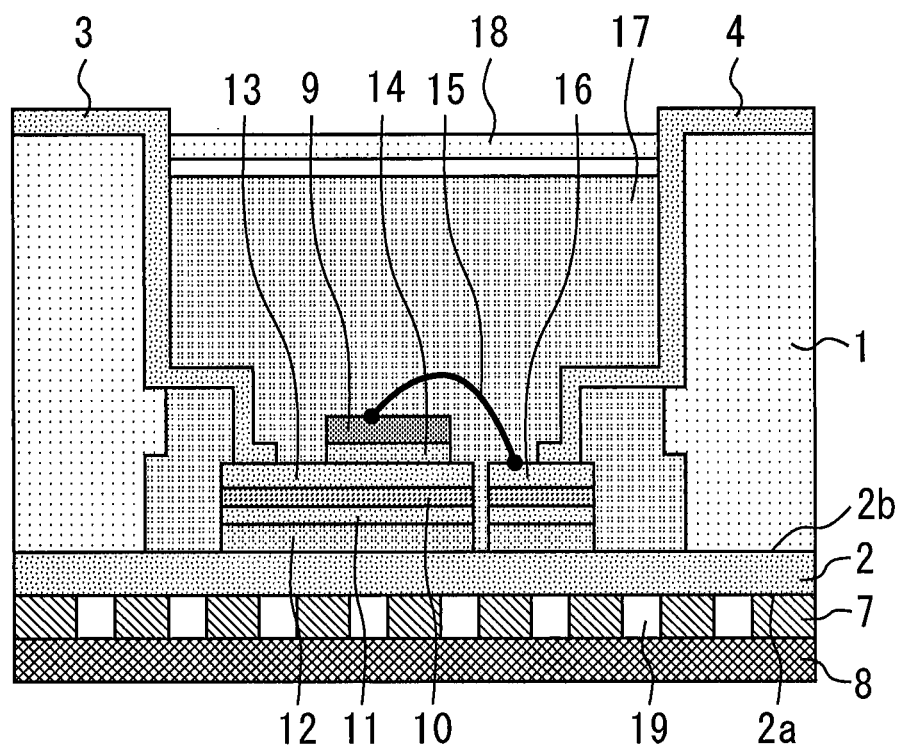
FIG. 4 is a cross-sectional view that illustrates an inner structure of the semiconductor device according to the embodiment.

FIG. 4 is a cross-sectional view that illustrates an inner structure of the semiconductor device according to the embodiment. A semiconductor chip 9 is mounted on the mounting surface 2b of the base plate 2. An insulation substrate 10 is provided between the base plate 2 and the semiconductor chip 9. A lower surface electrode 11 of the insulation substrate 10 is joined to the mounting surface 2b of the base plate 2 by solder 12. An upper surface electrode 13 of the insulation substrate 10 is joined to a lower surface electrode of the semiconductor chip 9 by solder 14. An upper surface electrode of the semiconductor chip 9 is connected with an upper surface electrode 16 of the insulation substrate 10 by a wire 15. An electrode plate may be used instead of the wire 15.

The casing 1 surrounds the semiconductor chip 9 and the insulation substrate 10 on the mounting surface 2b of the base plate 2. The main current terminals 3 are connected with the upper surface electrode 13. The main current terminals 4 are connected with the upper surface electrode 16. A sealing material 17 seals the semiconductor chip 9, the insulation substrate 10, the wire 15, and so forth in an inner portion of the casing 1. The sealing material 17 is gel or resin. A lid 18 covers an upper portion of the casing 1.

Figure 5:
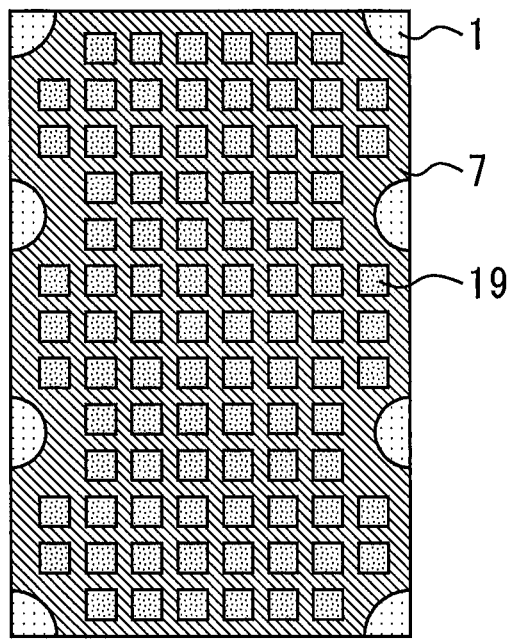
FIG. 5 is a bottom view that illustrates a state where the second sheet of the semiconductor device according to the embodiment is peeled off.

FIG. 5 is a bottom view that illustrates a state where the second sheet of the semiconductor device according to the embodiment is peeled off. The first sheet 7 has plural openings 19. The second sheet 8 has no opening and is provided throughout the whole surface of the heat dissipation surface of the base plate 2. Inner portions of the plural openings 19 of the first sheet 7 covered by the second sheet 8 are hollow and are not filled with grease or the like.

Figure 6:
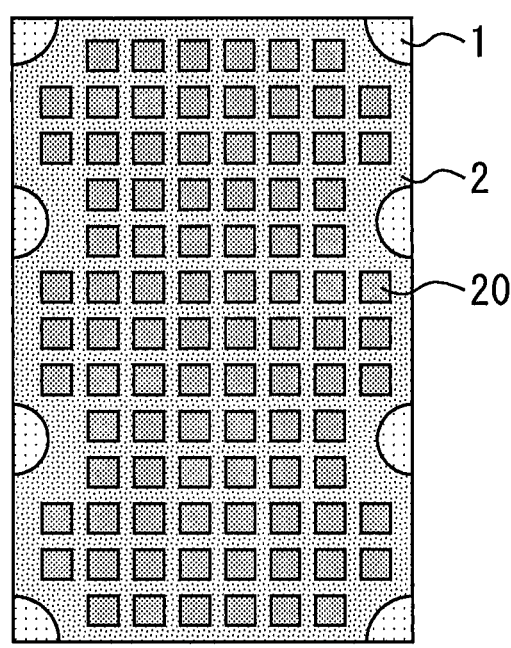
FIG. 6 is a bottom view that illustrates a state where the first sheet of the semiconductor device according to the embodiment is peeled off.

Next, a description will be made about work processes in a case where the semiconductor device according to this embodiment is mounted. First, the second sheet 8 is peeled off immediately before mounting the semiconductor device. Next, grease 20 as a heat dissipation material is applied to the plural openings 19. Next, the first sheet 7 is peeled off. FIG. 6 is a bottom view that illustrates a state where the first sheet of the semiconductor device according to the embodiment is peeled off. On the heat dissipation surface 2a of the base plate 2, the applied grease 20 remains in each of the positions in which the plural openings 19 are present. As described above, the first sheet 7 is used as a mask in application of the grease 20. Then, the semiconductor device is mounted by causing the base plate 2 to contact with a target object via the grease 20.

As described above, in this embodiment, the first sheet 7 having the plural openings 19 adheres to the heat dissipation surface 2a of the base plate 2, and the second sheet 8 covers the first sheet 7. The second sheet 8 is peeled off immediately before mounting the semiconductor device, and the grease 20 is applied to the base plate 2 by using the first sheet 7 as a mask. Because the grease 20 is applied immediately before use, a concern for degradation of the grease 20 over time may be avoided. Because the second sheet 8 covers the first sheet 7, the heat dissipation surface of the base plate 2 may be prevented from contacting with outside air. Accordingly, the base plate 2 may be prevented from being corroded or rusted due to outside air environments other than a temperature during transportation or use. Thus, long term storage is possible, and reliability may be retained.

The second sheet 8 is more easily peeled off than the first sheet 7. That is, the adhesive force between the base plate 2 and the first sheet 7 is stronger than the adhesive force between the first sheet 7 and the second sheet 8. Accordingly, the second sheet 8 may be peeled off with the first sheet 7 remaining. As methods of adhering the sheets, various methods such as an adhesive and pressure welding are possible. In particular, when an adhesive is used, the adhesive forces of the sheets are easily controlled. A sheet shape is devised, or a component such as a sticky note is interposed between both of the sheets, and only the second sheet 8 may thereby be peeled off with the first sheet 7 remaining.

The thickness of the first sheet 7 is preferably 70 μm to 100 μm, which is the same as the thickness of the grease 20 recommended by a maker. Accordingly, because the thickness of the grease 20 may appropriately be managed, reliability in actual use is improved.

The main current terminals 3 and 4 on an upper surface of the device may be protected by pasting sheets. However, because the grease is not applied to those terminals, the sheet does not have to have a two-layer structure as described above.

Figure 7:
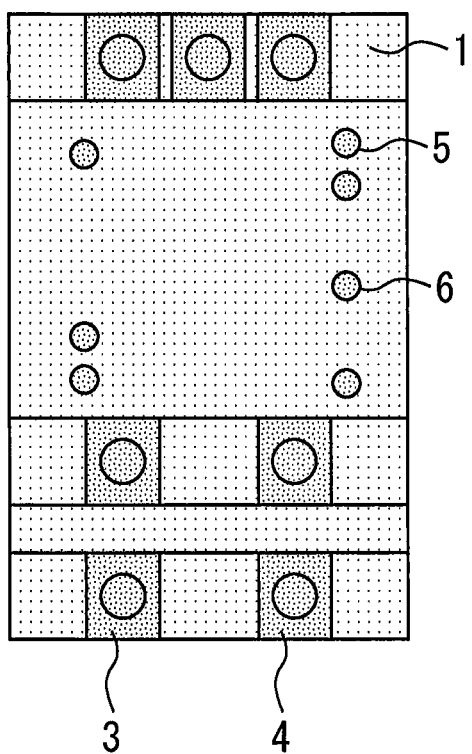
FIG. 7 is a top view that illustrates a first modification example of the semiconductor device according to the embodiment.
Figure 8:
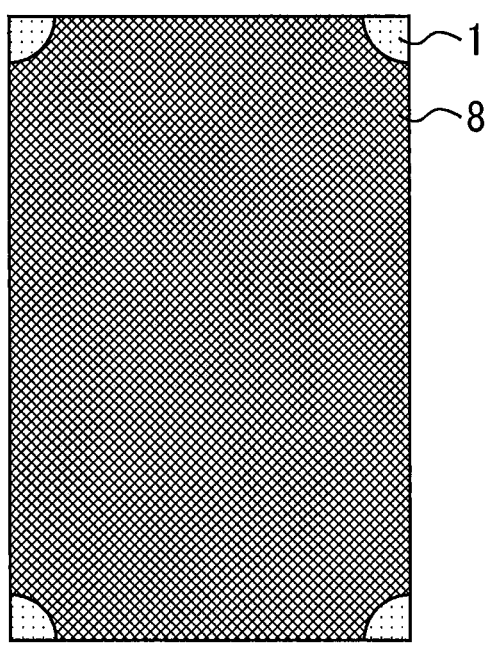
FIG. 8 is a bottom view that illustrates the first modification example of the semiconductor device according to the embodiment.
Figure 9:
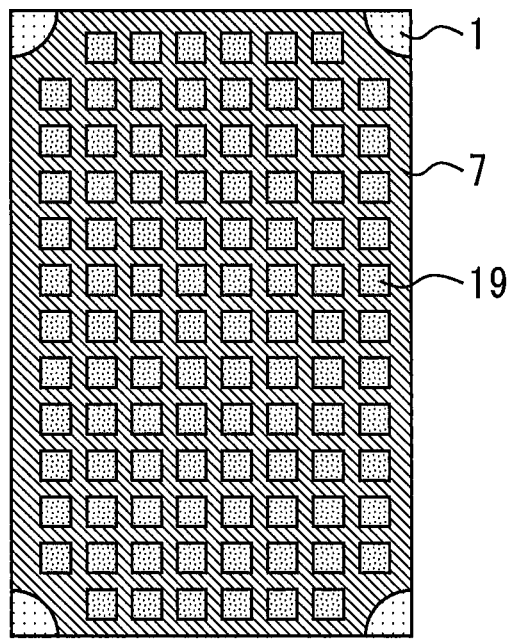
FIG. 9 is a bottom view that illustrates a state where a second sheet of the first modification example of the semiconductor device according to the embodiment is peeled off.
Figure 10:
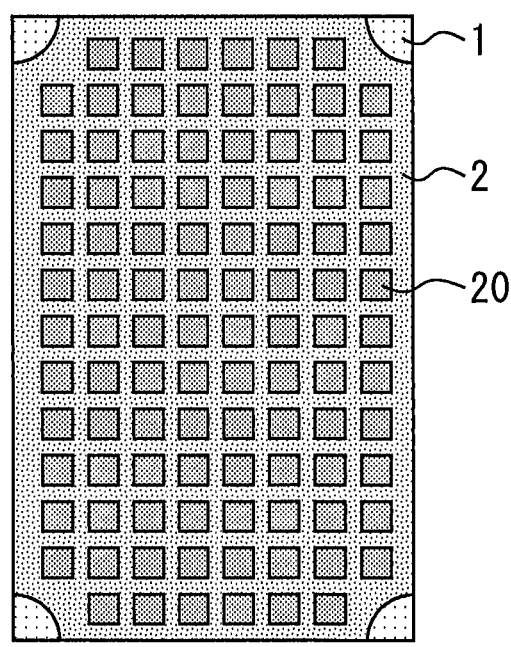
FIG. 10 is a bottom view that illustrates a state where the first sheet of the first modification example of the semiconductor device according to the embodiment is peeled off.

FIG. 7 is a top view that illustrates a first modification example of the semiconductor device according to the embodiment. FIG. 8 is a bottom view that illustrates the first modification example of the semiconductor device according to the embodiment. FIG. 9 is a bottom view that illustrates a state where a second sheet of the first modification example of the semiconductor device according to the embodiment is peeled off. FIG. 10 is a bottom view that illustrates a state where the first sheet of the first modification example of the semiconductor device according to the embodiment is peeled off. The first modification example corresponds to a next generation 2-in-1 product. Because the next generation 2-in-1 product has a high current density, a configuration of this embodiment is particularly effective.

Figure 11:
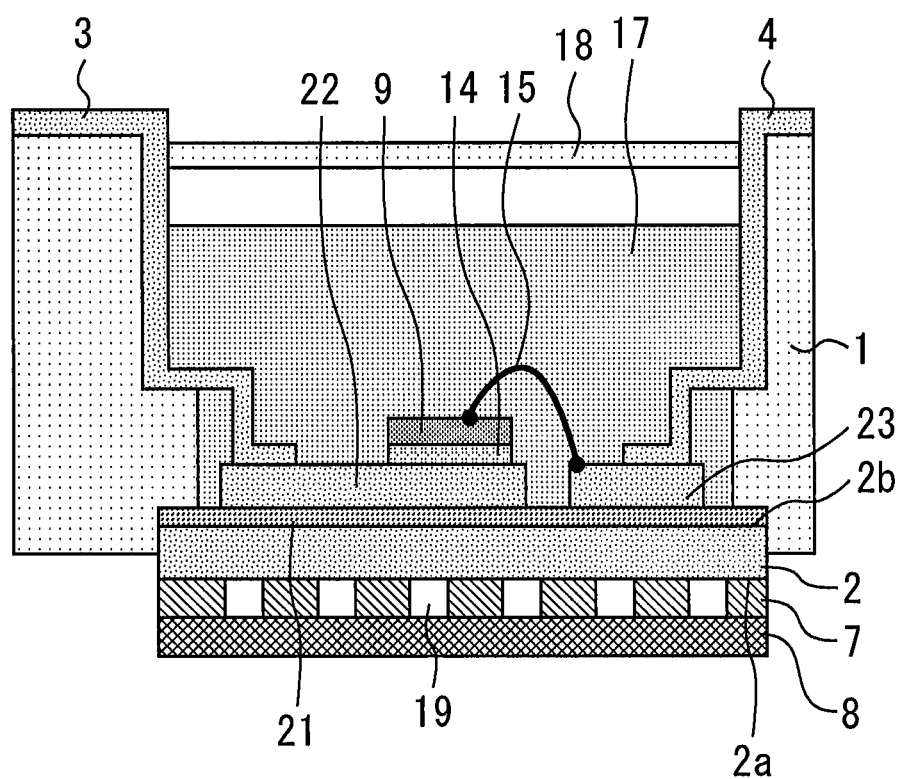
FIG. 11 is a cross-sectional view that illustrates an inner structure of a second modification example of the semiconductor device according to the embodiment.

FIG. 11 is a cross-sectional view that illustrates an inner structure of a second modification example of the semiconductor device according to the embodiment. An insulation film 21 is provided on the mounting surface 2b of the base plate 2 formed of Cu or the like. Electrodes 22 and 23 formed of Cu or the like are provided on the insulation film 21. The electrode 22 is joined to a lower surface electrode of the semiconductor chip 9 by the solder 14. An upper surface electrode of the semiconductor chip 9 is connected with the electrode 23 by the wire 15. The main current terminals 3 are connected with the electrode 22. The main current terminals 4 are connected with the electrode 23. The other configurations are the same as the configuration illustrated in FIG. 4. Such a configuration in which the insulation film 21 is provided on the mounting surface 2b of the base plate 2 may obtain similar effects to the above.

The semiconductor chip 9 is not limited to a device formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

A semiconductor device using a wide bandgap semiconductor is often used for an important usage such as a railroad that needs high efficiency. Consequently, the configuration of this embodiment is particularly effective because prevention of loss of reliability due to an outside air environment is highly necessary.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-027407, filed on Feb. 20, 2020 including specification, claims, drawings and summary, on which the convention priority of the present application is based, is incorporated herein by reference in its entirety.

The invention claimed is:

1. A semiconductor device comprising:
a base plate having a heat dissipation surface and a mounting surface opposite to each other;
a semiconductor chip mounted on the mounting surface of the base plate;
a sealing material sealing the semiconductor chip;
a first sheet adhering to the heat dissipation surface of the base plate and having plural openings; and
a second sheet covering the first sheet.

2. The semiconductor device according to claim 1, wherein inner portions of the plural openings are hollow.

3. The semiconductor device according to claim 1, wherein adhesive force between the base plate and the first sheet is stronger than adhesive force between the first sheet and the second sheet.

4. The semiconductor device according to claim 2, wherein adhesive force between the base plate and the first sheet is stronger than adhesive force between the first sheet and the second sheet.

5. The semiconductor device according to claim 1, wherein a thickness of the first sheet is 70 μm to 100 μm.

6. The semiconductor device according to claim 2, wherein a thickness of the first sheet is 70 μm to 100 μM.

7. The semiconductor device according to claim 3, wherein a thickness of the first sheet is 70 μm to 100 μm.

8. The semiconductor device according to claim 4, wherein a thickness of the first sheet is 70 μm to 100 μm.

9. The semiconductor device according to claim 1, wherein the semiconductor chip is formed of a wide-bandgap semiconductor.

10. The semiconductor device according to claim 2, wherein the semiconductor chip is formed of a wide-bandgap semiconductor.

11. The semiconductor device according to claim 3, wherein the semiconductor chip is formed of a wide-bandgap semiconductor.

12. The semiconductor device according to claim 4, wherein the semiconductor chip is formed of a wide-bandgap semiconductor.

13. The semiconductor device according to claim 5, wherein the semiconductor chip is formed of a wide-bandgap semiconductor.

14. The semiconductor device according to claim 6, wherein the semiconductor chip is formed of a wide-bandgap semiconductor.

15. The semiconductor device according to claim 9, wherein the wide-bandgap semiconductor is a silicon carbide, a gallium-nitride-based material, or diamond.

16. The semiconductor device according to claim 10, wherein the wide-bandgap semiconductor is a silicon carbide, a gallium-nitride-based material, or diamond.

17. The semiconductor device according to claim 11, wherein the wide-bandgap semiconductor is a silicon carbide, a gallium-nitride-based material, or diamond.

18. The semiconductor device according to claim 12, wherein the wide-bandgap semiconductor is a silicon carbide, a gallium-nitride-based material, or diamond.

19. The semiconductor device according to claim 13, wherein the wide-bandgap semiconductor is a silicon carbide, a gallium-nitride-based material, or diamond.

20. The semiconductor device according to claim 14, wherein the wide-bandgap semiconductor is a silicon carbide, a gallium-nitride-based material, or diamond.

* * * * *